United States Patent
Kim et al.

(10) Patent No.: US 12,410,092 B2
(45) Date of Patent: Sep. 9, 2025

(54) MANUFACTURING METHOD OF COVER WINDOW FOR FLEXIBLE DISPLAY DEVICE AND MANUFACTURING METHOD OF THE FLEXIBLE DISPLAY DEVICE

(71) Applicant: Samsung Display Co., Ltd., Yongin-si (KR)

(72) Inventors: Seung Kim, Seongnam-si (KR); Byung Hoon Kang, Hwaseong-si (KR); Seung Ho Kim, Anyang-si (KR); Gyu In Shim, Yongin-si (KR); Joo Woan Cho, Seongnam-si (KR); Byoung Kwon Choo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 856 days.

(21) Appl. No.: 17/212,885

(22) Filed: Mar. 25, 2021

(65) Prior Publication Data
US 2022/0048813 A1 Feb. 17, 2022

(30) Foreign Application Priority Data

Aug. 13, 2020 (KR) .................. 10-2020-0101609

(51) Int. Cl.
*C03C 15/00* (2006.01)
*B32B 17/10* (2006.01)
(Continued)

(52) U.S. Cl.
CPC ............ *C03C 21/002* (2013.01); *B32B 17/10* (2013.01); *C03C 15/00* (2013.01); *C03C 23/0025* (2013.01); *H05K 1/028* (2013.01); *H05K 1/0393* (2013.01); *H05K 1/118* (2013.01); *B32B 2457/20* (2013.01)

(58) Field of Classification Search
None
See application file for complete search history.

(56) References Cited

U.S. PATENT DOCUMENTS 6,949,215 B2 * 9/2005 Yamada ................ C03C 17/002
219/121.72
10,056,444 B2 8/2018 Cho et al.
(Continued)

FOREIGN PATENT DOCUMENTS

CN 103025472 A 4/2013
CN 108975718 A * 12/2018 ............. C03C 15/00
(Continued)

OTHER PUBLICATIONS

KR2017-0122554A EPO Machine Translation retrieved Nov. 16, 2023. (Year: 2023).*
(Continued)

*Primary Examiner* — Lisa L Herring
(74) *Attorney, Agent, or Firm* — Womble Bond Dickinson (US) LLP

(57) ABSTRACT

A method of manufacturing a cover window for a display device includes: providing a glass substrate having a bendable area and a flat area; modifying the bendable area by irradiating the glass substrate with a beam; and etching the bendable area to have a thinner thickness than the flat area. The bendable area may have a faster etch rate than the flat area due to the modifying of the bendable area.

14 Claims, 16 Drawing Sheets

(51) Int. Cl.
*C03C 21/00* (2006.01)
*C03C 23/00* (2006.01)
*H05K 1/02* (2006.01)
*H05K 1/03* (2006.01)
*H05K 1/11* (2006.01)

(56) References Cited

U.S. PATENT DOCUMENTS

| | | |
|---|---|---|
| 10,071,933 B2 | 9/2018 | Wang et al. |
| 10,403,698 B2 | 9/2019 | Cho et al. |
| 10,825,878 B2 | 11/2020 | Cho et al. |
| 10,991,919 B2 | 4/2021 | Kishimoto |
| 11,647,652 B2 | 5/2023 | Cho et al. |
| 11,864,396 B2 | 1/2024 | Cho et al. |
| 12,044,822 B2 | 7/2024 | Park et al. |
| 2005/0247685 A1* | 11/2005 | Tanaka ............... B23K 26/0608 219/121.82 |
| 2012/0129359 A1 | 5/2012 | Shimoi et al. |
| 2017/0239771 A1 | 8/2017 | Park et al. |
| 2019/0255649 A1* | 8/2019 | Kurosaki ........... B23K 26/0622 |
| 2021/0107829 A1* | 4/2021 | Chen .................... G06F 1/1637 |
| 2021/0210736 A1 | 7/2021 | Kishimoto |
| 2022/0158124 A1* | 5/2022 | Koo ....................... H10K 50/84 |

FOREIGN PATENT DOCUMENTS

| | | | |
|---|---|---|---|
| CN | 109773981 A | 5/2019 | |
| JP | 2011-000631 A | 1/2011 | |
| JP | 6479884 B2 | 3/2019 | |
| JP | 6674592 | 11/2019 | |
| KR | 10-2017-0100104 A | 9/2017 | |
| KR | 10-2017-0122554 A | 11/2017 | |
| KR | 10-2018-0038606 A | 4/2018 | |
| KR | 10-2018-0132201 A | 12/2018 | |
| KR | 10-2068685 | 1/2020 | |
| KR | 10-2111138 B1 | 5/2020 | |
| WO | WO-2012161317 A1 * | 11/2012 | ............ B23K 26/40 |
| WO | WO-2020241371 A1 * | 12/2020 | |

OTHER PUBLICATIONS

WO2020/024137A1 EPO Machine Translation retrieved Nov. 17, 2023. (Year: 2023).*
CN-108975718-A Machine Translation by Clarivate Analytics retrieved Nov. 17, 2023. (Year: 2023).*
WO2012/0161317 Machine Translation by Clarivate Analytics retrieved Nov. 17, 2023. (Year: 2023).*
Chinese Office Action dated May 29, 2025, issued in corresponding Chinese Patent Application No. 202110835760.4, 12 pages.

* cited by examiner

MANUFACTURING METHOD OF COVER WINDOW FOR FLEXIBLE DISPLAY DEVICE AND MANUFACTURING METHOD OF THE FLEXIBLE DISPLAY DEVICE

CROSS-REFERENCE TO RELATED APPLICATION

This application claims priority to and the benefit of Korean Patent Application No. 10-2020-0101609 filed in the Korean Intellectual Property Office on Aug. 13, 2020, the entire contents of which are incorporated herein by reference.

BACKGROUND

1. Field

This disclosure relates to a flexible display device, a cover window for the flexible display device, and a method of manufacturing the cover window for the flexible display device.

2. Description of the Related Art

Electronic devices such as a mobile phone, a tablet, a multimedia player, a television, and the like include a display device for displaying an image. The display device includes a display panel that implements a screen where an image is displayed. A flexible display device that uses a flexible display panel as a substrate of the display panel has been developed.

The above information disclosed in this Background section is only for enhancement of understanding of the background, and therefore it may contain information that does not form the prior art that is already known in this country to a person of ordinary skill in the art.

SUMMARY

A flexible display device may include a cover window that can transmit an image displayed by a flexible display panel, while protecting the flexible display panel from external environmental factors (e.g., impact). Glass may be utilized for the cover window. When the cover window is thin, the flexible characteristic (flexibility) of the cover window can be increased, but the impact resistance may be deteriorated. Therefore, it may be desirable to partially make a predetermined portion that exhibits a flexible characteristic in the cover window thin.

Embodiments include a method of manufacturing a cover window that includes forming a predetermined area of a cover window to be thin, and improving the required characteristics of the cover window. Embodiments also include a method for manufacturing a flexible display device that includes the cover window.

A method of manufacturing a cover window for a display device, according to an embodiment, includes: providing a glass substrate including a bendable area and a flat area; modifying the bendable area by irradiating the glass substrate with a beam; and etching the bendable area to have a thinner thickness than the flat area.

The beam may be a laser beam or a halogen beam.

The beam may be a line beam or a planar-shaped beam.

The beam may have an intensity that decreases from a center of the bendable area toward a boundary between the bendable area and the flat area.

In the modifying of the bendable area, a modification depth of the glass substrate may decrease from a center of the bendable area toward a boundary between the bendable area and the flat area.

The bendable area may be etched faster than the flat area in the etching task due to the task of modifying the bendable area.

The etching of the bendable area may also include heating the bendable area to be a higher temperature than the flat area.

In the heating, a temperature applied to the bendable area may have a Gaussian distribution with respect to a center line of the bendable area.

In the etching of the bendable area, a groove may be formed in the bendable area.

The groove may have a depth that decreases from a center of the bendable area toward a boundary between the bendable area and the flat area.

A method of manufacturing a flexible display device according to an embodiment, includes: providing a glass substrate including a bendable area and a flat area; irradiating at least the bendable area of the glass substrate with a beam; etching the glass substrate, wherein the bendable area is etched faster than the flat area; and attaching a display panel to the glass substrate.

The beam may be a laser beam or a halogen beam.

The beam may be a line beam or a planar-shaped beam.

The beam may have an intensity that decreases from a center of the bendable area toward a boundary between the bendable area and the flat area.

In the irradiating of the beam, the glass substrate may be modified with a depth that decreases from a center of the bendable area toward a boundary between the bendable area and the flat area.

The bendable area may be etched faster than the flat area in the etching due to the irradiating of the beam.

The etching of the glass substrate may include heating the bendable area to have a higher temperature than the flat area.

In the heating, a temperature applied to the bendable area may have a Gaussian distribution with respect to a center line of the bendable area.

In the etching of the glass substrate, a groove may be formed in the bendable area.

The bendable area may have a groove surface that forms the groove, and the groove surface may have a series of curvature radii. One end and the other end of the groove surface each may have a minimum curvature radius among the series of curvature radii.

According to the embodiments of the present disclosure, a predetermined area (e.g., bendable area) of the cover window can be formed thin, and the impact resistance and flexible characteristics of the cover window can be improved. In addition, the yield of the process of manufacturing the cover window can be improved, and it can be advantageous for stabilizing the external dimensions. In addition, the cross-section of a thin area (e.g., the bendable area) can be etched to have a Gaussian distribution, and a cover window in which the boundary between the thin area and the thick area is not visually recognized or perceptible by a user can be provided. Further, according to the embodiments, there are advantageous effects that can be recognized throughout the specification.

DETAILED DESCRIPTION

Figure 1A:
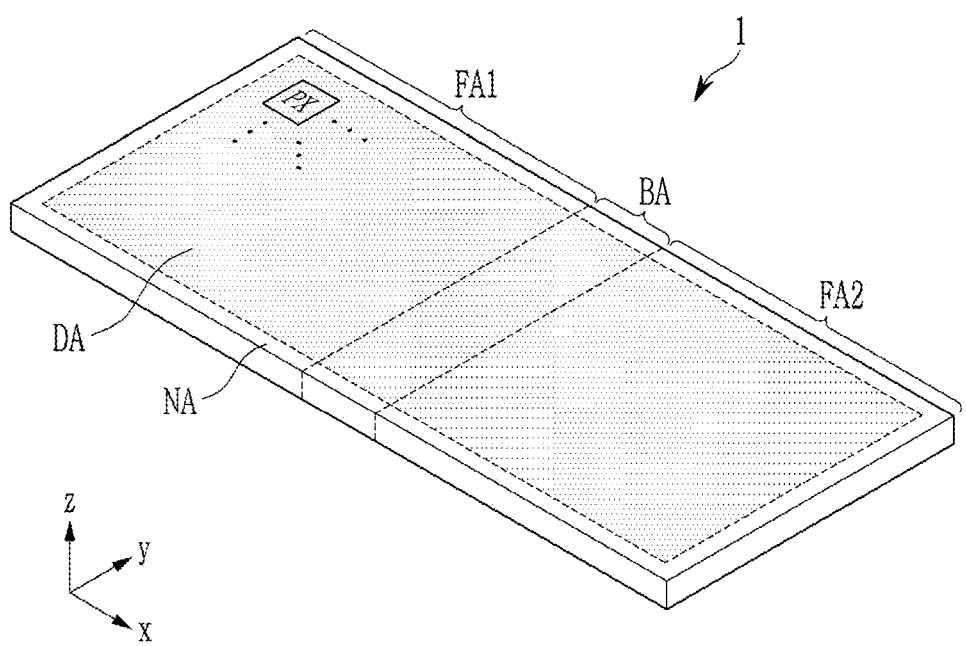
FIG. 1A, FIG. 1B and FIG. 1C are schematic perspective views of a flexible display device according to an embodiment.

Hereinafter, the inventive concept will be described more fully with reference to the accompanying drawings, in which embodiments of the inventive concept are shown.

In the drawings, the thicknesses of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

Throughout the specification, "connected" does not mean only when two or more constituent elements are directly connected, but also when two or more constituent elements are indirectly connected through another constituent element, or when physically connected or electrically connected, and it may include a case in which substantially integral parts are connected to each other although they are referred to by different names according to positions or functions.

In the drawing, symbols "x", "y", and "z" are used to indicate directions, where "x" is a first direction, "y" is a second direction that is perpendicular to the first direction, and "z" is a third direction that is perpendicular to the first direction and the second direction. The first direction x, the second direction y, and the third direction z may correspond to a horizontal direction, a vertical direction, and a thickness direction of the display device, respectively.

Unless otherwise specified in the specification, "overlapping" means overlapping in the plan view, and overlapping in the third direction (z-axis direction).

Figure 1B:
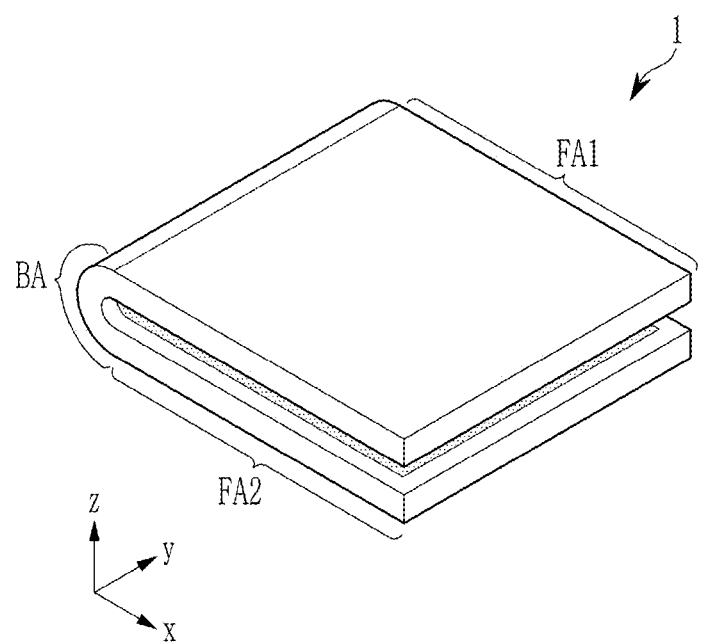
Figure 1C:
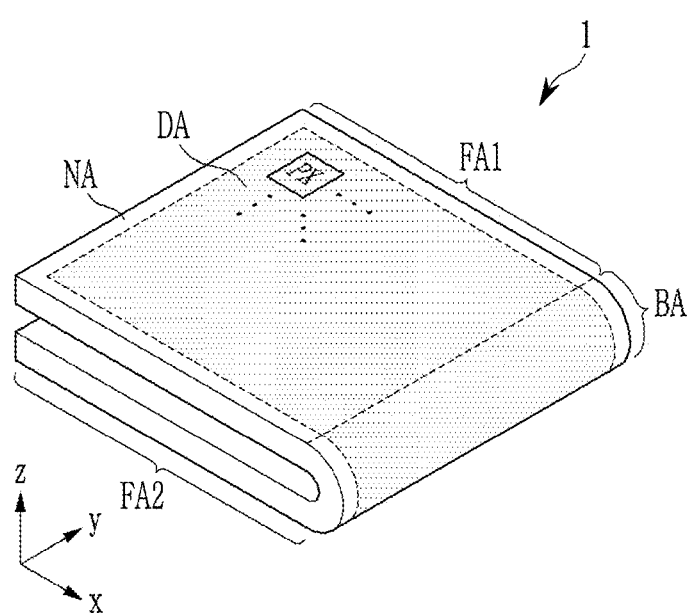

FIG. 1A, FIG. 1B, and FIG. 1C are schematic perspective views of a flexible display device according to an embodiment. FIG. 1A, FIG. 1B, and FIG. 1C respectively show an unfolded state, a first folding state, and a second folding state of the flexible display device.

A flexible display device 1 (hereinafter, simply referred to as a display device) may be unfolded to be wholly flat as shown in FIG. 1A, and may be a foldable display device that can be folded as shown in FIG. 1B and/or FIG. 1C. The display device 1 may include a bendable area BA, and a first flat area FA1 and a second flat area FA2 that are disposed at opposite sides of the bendable area BA. The bendable area BA is a portion that is bent when the display device 1 is being folded (or is in a folded configuration), and the first flat area FA1 and the second flat area FA2 are portions that are not bent.

Although in the illustrated embodiment one bendable area BA is illustrated, in one or more embodiments, the display device 1 may include a plurality of bendable areas BA that are disposed apart from each other (e.g., the display device 1 may include a plurality of bendable areas BA that are bendable with different curvature radiuses). For example, the display device 1 may include two or more bendable areas and three or more flat areas.

The display device 1 may include a display area DA where an image is displayed, and a non-display area NA that surrounds the display area DA. The display area DA may correspond to a screen where pixels PX are arranged. The non-display area NA may correspond to a bezel. The display device 1 may include a display panel that implements the screen, and a cover window that covers the display panel.

As shown in FIG. 1B, the display device 1 may be folded (hereinafter, referred to as in-folding) such that portions of the screen face each other, that is, the screen portion of the first flat area FA1 and the screen portion of the second flat area FA2 face each other. As shown in FIG. 1C, the display device 1 may be folded (hereinafter, referred to as out-folding) such that the screen is exposed to the outside (i.e., the screen portion of the first flat area FA1 and the screen portion of the second flat area FA2 face away from each other). In the in-folding state, the screen portion of the bendable area BA may be hidden. In the out-folding state, the screen portion of the bendable area BA may be exposed to be seen by a user. The display device 1 may be designed to enable only one of in-folding and out-folding, or both. When the display device 1 includes a plurality of bendable areas BA, one of them may be a bendable area capable of in-folding and the other may be a bendable area capable of out-folding.

The display device 1 may further include a housing, and various parts constituting the display device 1, for example, a display panel, a driving apparatus, a flexible printed circuit (FPC), an application processor, a memory, a speaker, and various sensors can be positioned within a space confined by the cover window and the housing.

Figure 2:
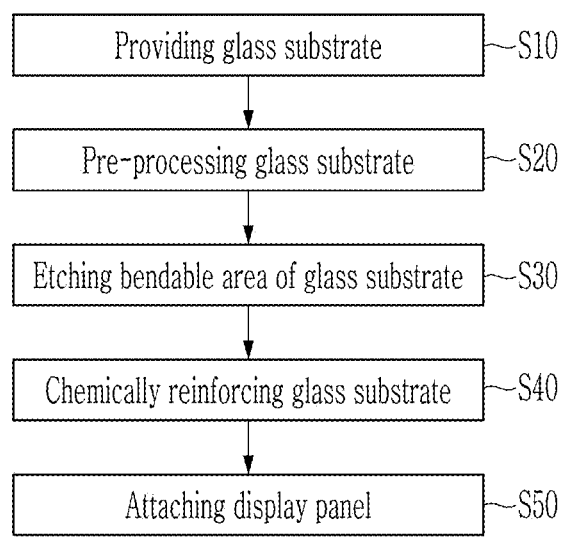
FIG. 2 is a flowchart of a manufacturing method of the display device according to the embodiment.
Figure 3A:
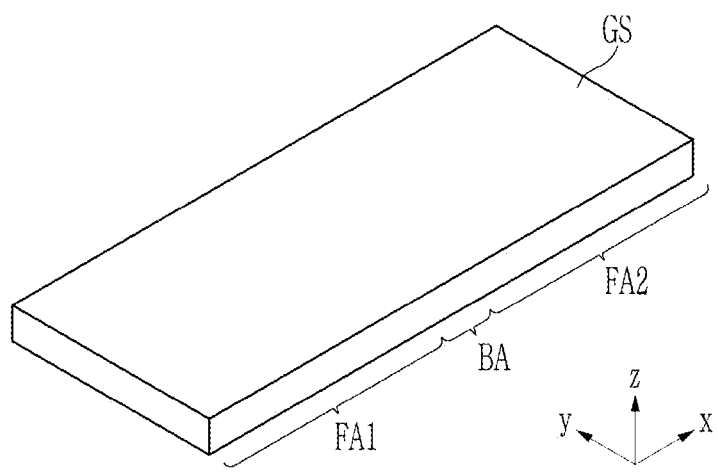
FIG. 3A, FIG. 3B and FIG. 3C are schematic views of a manufacturing method of the cover window according to the embodiment.
Figure 3B:
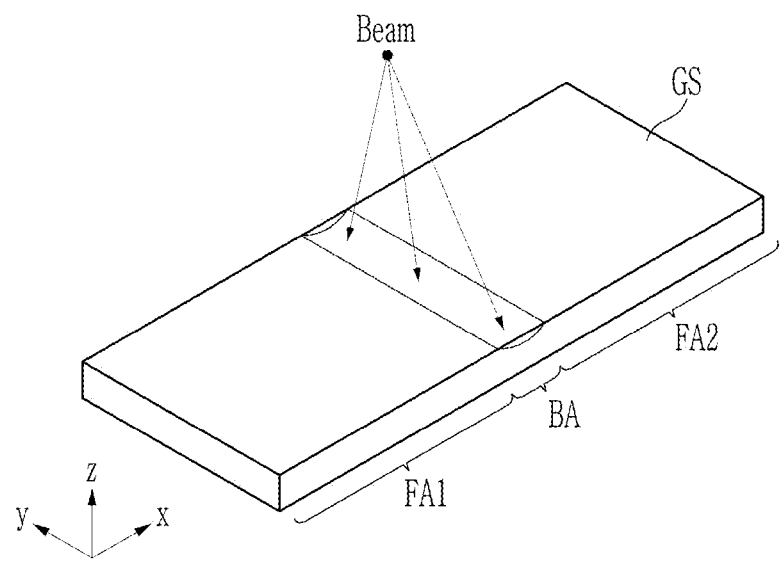
Figure 3C:
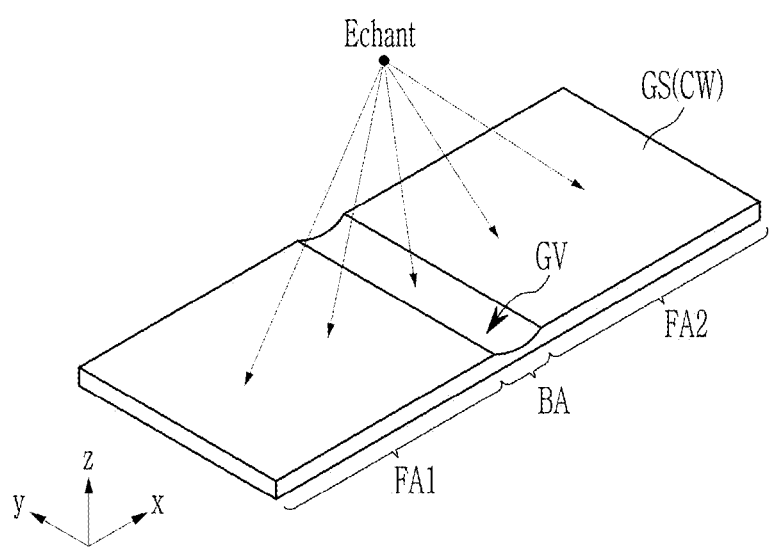

FIG. 2 is a flowchart of a method of manufacturing the display device according to the embodiment, and FIG. 3A, FIG. 3B, and FIG. 3C are schematic views of a method of manufacturing the cover window according to the embodiment.

Referring to FIG. 2, the method of manufacturing the display device may include providing a glass substrate (S1), pre-processing the glass substrate (S20), etching a bendable area of the glass substrate (S30), chemically reinforcing the glass substrate (S40), and attaching the display panel to the glass substrate (S50).

Referring to FIG. 2 and FIG. 3A, the task of providing (S10) the glass substrate GS may include a task of preparing an optically transparent glass substrate GS with a constant thickness overall or a substantially constant thickness overall (e.g., a thickness of about 50 μm to about 200 μm). The glass substrate GS may be a cell unit (corresponding to one cover window), or may be a mother board unit (corresponding to a plurality of cover windows). For ease of processing, the glass substrate GS may be fixed to the stage. A bendable area BA and flat areas FA1 and FA2 on respective sides of the bendable area BA can be defined in the glass substrate GS.

Referring to FIG. 2 and FIG. 3B, the task of pre-processing (S20) of the bendable area BA of the glass substrate GS can be carried out following the task of providing (S10) the glass substrate GS. The pre-processing (S20) is modification of glass material of the bendable area BA by irradiating one or more beams to the bendable area BA of the glass substrate GS. The modified bendable area BA may be etched better (e.g., exhibit an increased etch-rate) compared to un-modified flat areas FA1 and FA2 that were not irradiated or were not irradiated to the same extent or degree as the bendable area BA. Thus, the task of pre-processing (S20) is configured to increase the selectivity of the bendable area BA in the subsequent etching task (S30).

The irradiated beam utilized in the task of pre-processing (S20) may be laser beams or halogen beams. Beam energy may exceed a limit value for modification of the glass substrate GS. The modification of the glass substrate GS may achieve a change in refractive index, a change in material density, melting, compacting, a change in ablation, and/or a chemical change in the material of the bendable area BA of the glass substrate GS. In addition, the modification may include cracking of the material to create microscopic fissures or voids that may facilitate penetration of an etchant. In addition, the modification may change a bonding angle of a silicon oxide (e.g., silica) constituting (or included within) the glass substrate GS. The modification level (i.e., the extent or degree of the modification) of the glass substrate GS may be reduced in a direction starting from the center of the bendable area BA and toward the boundary between the bendable area BA and the flat areas FA1 and FA2. The depth of the modification to the properties (e.g., refractive index, material density, melting capacity, ablation capacity, and/or chemical change) of the bendable area BA achieved in the pre-processing (S20) task may decrease in a direction starting from the center of the bendable area BA and toward the boundary between the bendable area BA and the flat areas FA1 and FA2 (i.e., the depth of the modification to the bendable area BA may be a maximum in the center of the bendable area BA and the depth of the modification to the bendable area may decrease in the +x-direction and the −x-direction toward the boundary between the bendable area BA and the flat areas FA1 and FA2).

Referring to FIG. 2 and FIG. 3C, after the pre-processing (S20) of the glass substrate GS, the etching (S30) of the bendable area BA of the glass substrate GS can be performed. By etching the bendable area BA, a groove GV may be formed in the bendable area BA, and a thickness of the bendable area BA may become thinner than the thicknesses of the flat areas FA1 and FA2. For example, a thickness of the thinnest portion of the bendable area BA following the task of etching (S30) the bendable area BA may be about 50 μm or less, about 40 μm or less, or about 30 μm or less. Thicknesses of the flat areas FA1 and FA2 may be about 50 μm or more, about 60 μm or more, or about 70 μm or more. The groove GV may be formed along the second direction (y-axis in FIG. 3C) (i.e., the groove GV may be oriented lengthwise along the second direction, the y-axis) with a predetermined depth and width. The width of the groove GV may be equal to or almost the same as the width of the bendable area BA. As the depth of the groove GV is increased, the thickness of the bendable area BA may be decreased. The depth of the groove GV may decrease in a direction starting from the center of the bendable area BA and toward the boundary between the bendable area BA and the flat areas FA1 and FA2 (i.e., the depth of the groove GV may be a maximum in the center of the bendable area BA and the depth of the groove GV may decrease in the +x-direction and the −x-direction toward the boundary between the bendable area BA and the flat areas FA1 and FA2).

Wet etching such as a spray method, a dip method, and/or a down-flow method may be utilized in the etching (S30) task. In the etching (S30) task, the entire glass substrate GS may be exposed to the etchant. Accordingly, not only the bendable area BA but also the flat areas FA1 and FA2 can be etched. However, since the bendable area BA was modified by the pre-processing (S20) task, an etching rate of the bendable area BA can be increased compared to etching rates of the flat areas FA1 and FA2 that were not modified by the pre-processing (S20) task. In addition, an etching reaction speed of the bendable area BA can be increased by increasing a temperature of the bending area BA during the etching (S30) task, thereby increasing etching etch selectivity of the bendable area BA, and this will be described later. In one or more embodiments, only the bendable area BA may be exposed to the etchant during the etching (S30) task.

A cover window (CW) suitable for a flexible display device can be manufactured by selectively reducing the thickness of the bendable area BA and relatively increasing the thickness of the flat areas FA1 and FA2. That is, it is possible to increase the impact resistance of the flat areas FA1 and FA2 in the cover window CW, and to improve the flexible characteristic of the bendable area BA.

The increase in the thicknesses of the flat areas FA1 and FA2 can be effective not only to protect display panels and the like but also to prevent damage to the cover window CW.

The cover window CW (or the glass substrate GS) may be loaded and transported in a cassette during the process step. A portion of the glass substrate GS that contacts the cassette due to selective etching, that is, the flat areas F1 and F2, can be formed with a predetermined thickness, so a breakage rate of the portion of the glass substrate GS that contacts the cassette can be reduced and the yield can be improved.

The cover window CW that corresponds to predetermined dimensions can be manufactured by the etching (S30) task, and a task performed to increase the strength of the cover window CW (e.g., chemical strengthening (S40) of the glass substrate GS) can be performed following the task of etching (S30). The chemical strengthening (S40) may include replacing ions of the glass substrate GS with other ions. For example, when the glass substrate GS is immersed in a high temperature molten alkali salt, some of sodium ions ($Na^+$) on the surface of the glass substrate GS are exchanged for potassium ions ($K^+$). Potassium ions ($K^+$) are larger than sodium ions (Na+), and when cooling, a compressive stress layer is formed in the glass substrate GS, thereby increasing the strength of the glass substrate GS.

The shaping of a beam irradiated to the glass substrate GS in the pre-processing (S20) task will now be described.

Figure 4A:
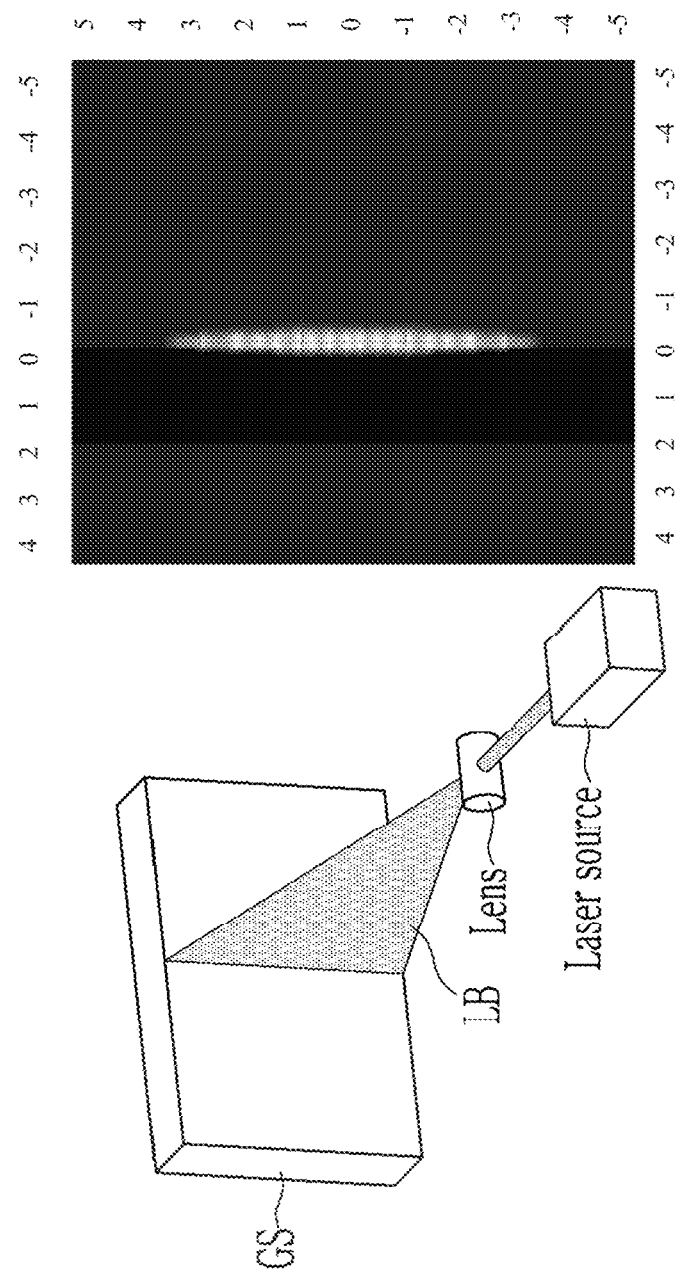
FIG. 4A and FIG. 4B are schematic views of line beam shaping during the manufacturing method.
Figure 4B:
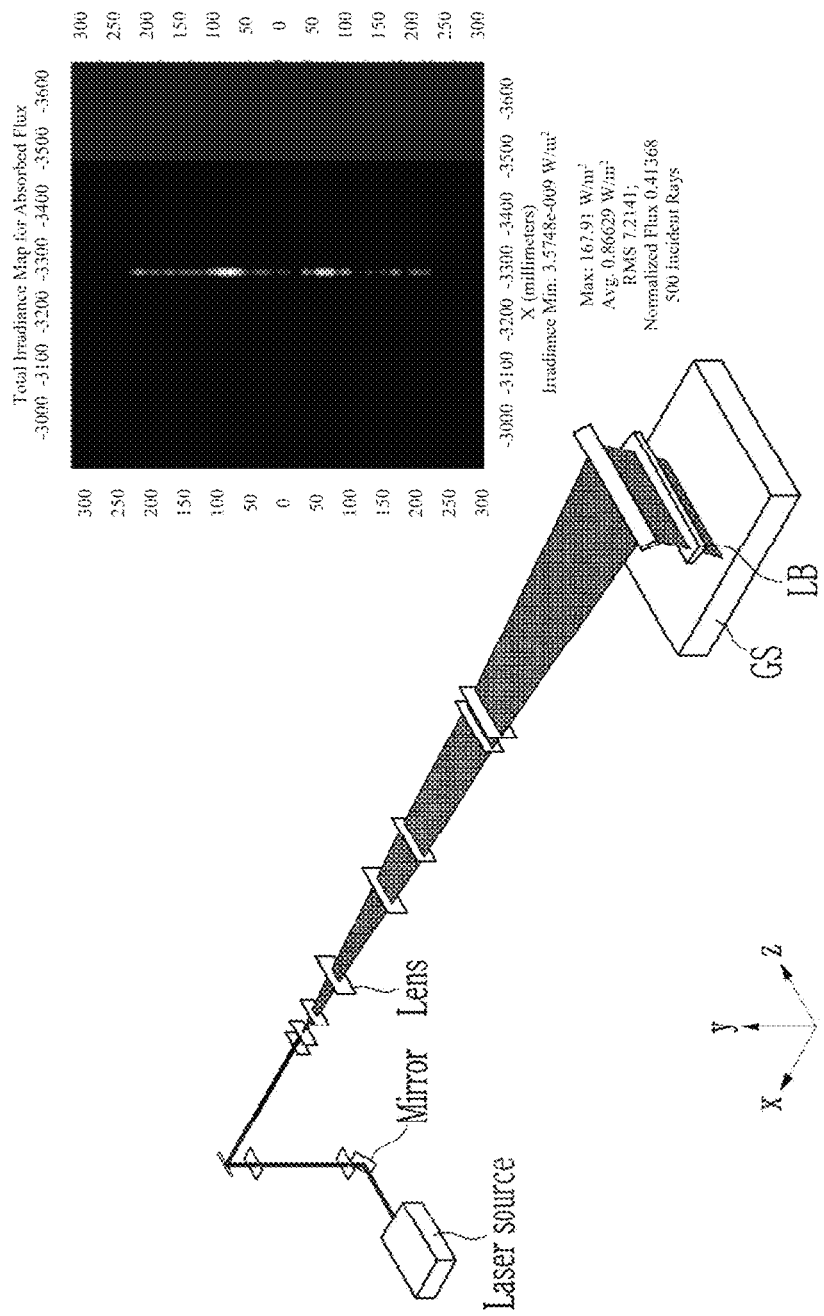
Figure 5:
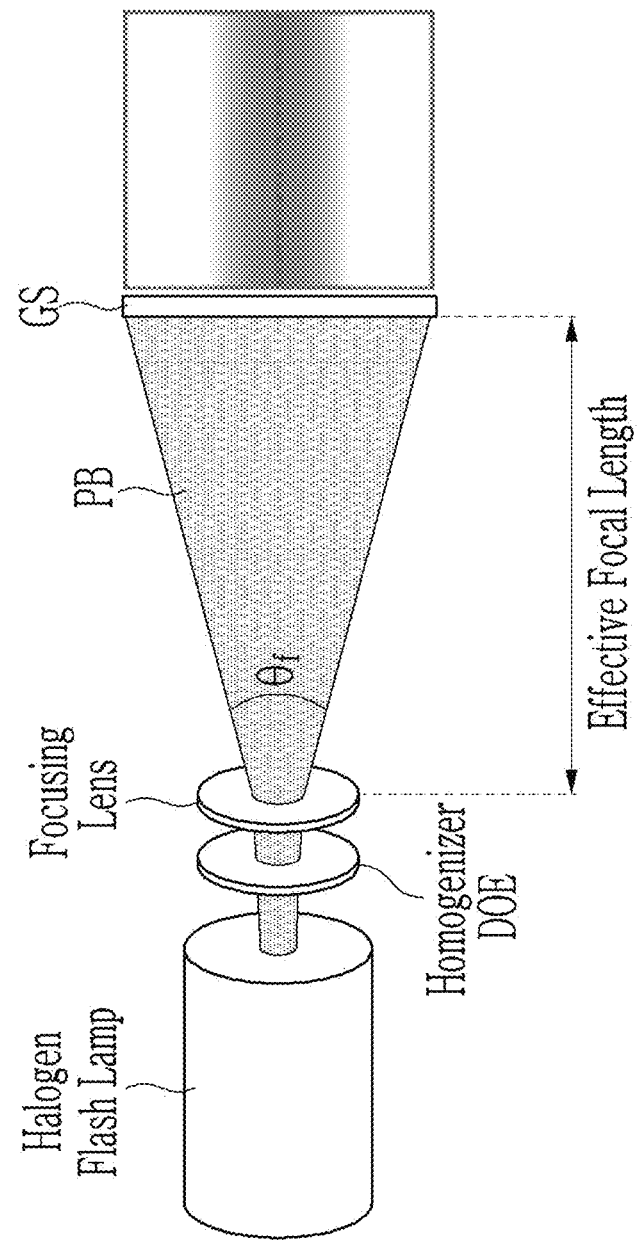
FIG. 5 is a schematic view of planar beam shaping during the manufacturing method.
Figure 6:
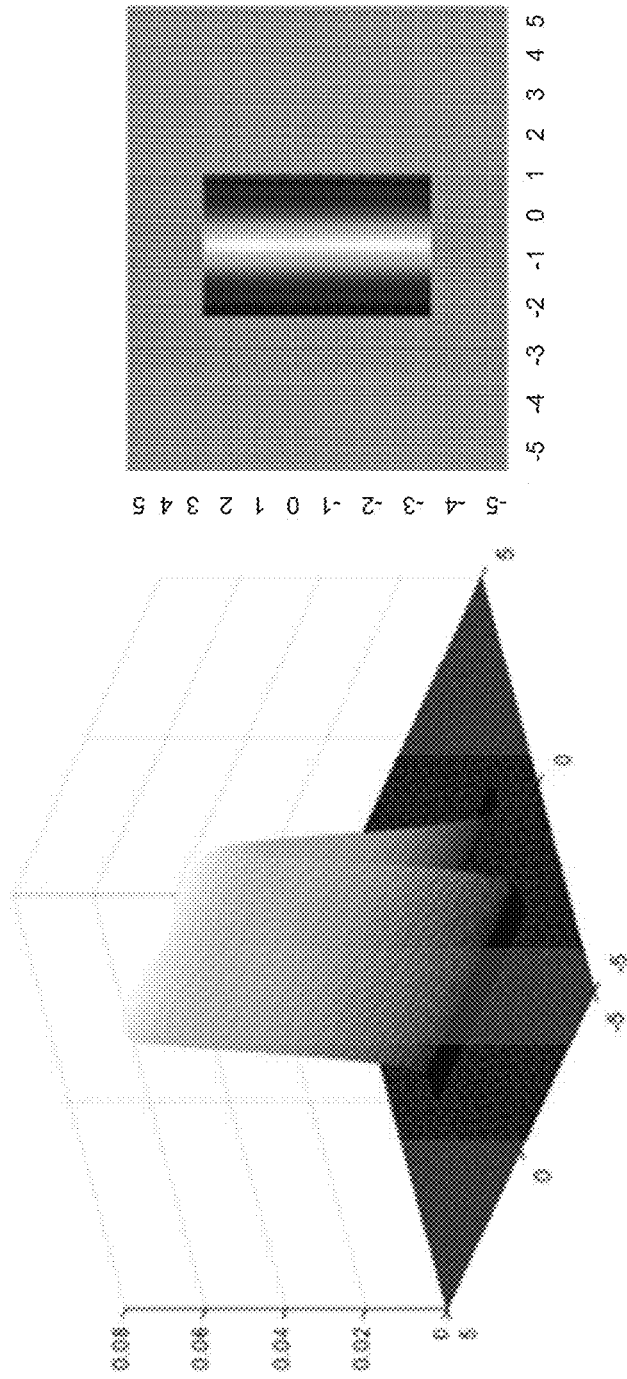
FIG. 6 shows graphs that illustrate light distribution of the beam irradiated to the bendable area of the cover window during the manufacturing method.

FIG. 4A and FIG. 4B are schematic views of line beam shaping, FIG. 5 is a schematic view of planar beam shaping, and FIG. 6 shows graphs that illustrate light distribution of the beam irradiated to the bendable area BA of the cover window CM (or the glass substrate GS).

In the pre-processing (S20) task for the modification of the glass material, the glass substrate GS may be irradiated with a line beam LB. As shown in FIG. 4A, the line beam LB may be implemented by passing a laser beam emitted from a laser source (e.g., a picosecond or femtosecond laser source) through a cylindrical lens. The line beam LB is straightforward to implement, but it may be difficult to achieve uniformity to an appropriate level or degree. As shown in FIG. 4B, when a plurality of lenses and a plurality of mirrors are combined, a line beam LB having high uniformity can be achieved while controlling a path of the laser beam emitted from the laser source. In FIG. 4A, the drawing on the right is an irradiance map of a line beam formed using a cylindrical lens, and in FIG. 4B, the drawing on the right is an illuminance map of a line beam formed by combining a plurality of lenses and a plurality of mirrors. It can be seen that the line beam LB of FIG. 4B (which utilizes a plurality of lenses and mirrors) is more uniform than the line beam LB of FIG. 4A (which utilizes a single lens).

The line beam LB illustrated in FIG. 4B may be utilized to irradiate the bendable area BA of the glass substrate GS in the pre-processing (S20) task. For example, when a width of the line beam LB is set to correspond to a width of the bendable area BA, the entire bendable area BA can be irradiated at once without scanning the line beam LB. The line beam LB may be a Gaussian beam, a Bessel-Gauss beam, or a Bessel beam.

Referring to FIG. 5, a planar beam PB may be formed using a halogen lamp (or a halogen flash lamp). For example, a planar-shaped beam PB irradiated to the glass substrate GS can be formed by combining a filter with a halogen beam emitted from the halogen flash lamp. For example, a planar-shaped beam PB having a predetermined size may be formed by controlling a diffusion angle (θf) of the halogen beam through a focus lens. In addition, the intensity can be adjusted so that energy can be concentrated in the bendable area BA of the glass substrate GS, and the bendable area BA can be modified. The planar-shaped beam PB may be irradiated to the flat areas FA1 and FA2 of the glass substrate GS in the pre-processing (S20) task, but the energy intensity irradiated in the flat areas FA1 and FA2 is weaker than that of the bendable area and thus the flat areas FA1 and FA2 may not be modified or may be modified to a very shallow depth (i.e., the flat area FA1 and FA2 may be modified less than the bendable area BA by the planar beam PB). Thus, it is possible to increase the etching selectivity between the bendable area BA and the flat areas FA1 and FA2 in the subsequent etching (S30) process (i.e., the bendable area BA may be more susceptible to etching than the flat area FA1 and FA2). In addition to the halogen lamp, various lamps capable of instantaneously irradiating strong optical energy such as xenon lamps and LED lamps may be used to form the planar-shaped beam PB and to modify the glass substrate GS.

The intensity of the line beam PB or the planar-shaped beam PB may decrease in a direction toward the boundary between the bendable area BA and the flat areas FA1 and FA2 from the center of the bendable area BA (e.g., in a Gaussian distribution as shown in FIG. 6) (i.e., the intensity of the beam may be a maximum in the center of the bendable area BA and the intensity of the beam may decrease in the +x-direction and the −x-direction toward the boundary between the bendable area BA and the flat areas FA1 and FA2). Accordingly, a modification depth of the glass substrate GS may decrease in a direction from the center of the bendable area BA toward the boundary between the bendable area BA and the flat areas FA1 and FA2. As a result, when the bendable area BA is etched, the slope of the surface is insubstantially changed before and after the boundary between the bendable area BA and the flat areas FA1 and FA2, such that a very smooth and uniform groove GV may be formed in the bendable area BA. In addition, because the intensity of the beam decreases in a direction toward the boundary between the bendable area BA and the flat areas FA1 and FA2, it is possible to stabilize gradation morphology at the boundary between the bendable area BA and the flat areas FA1 and FA2.

As the boundary between the bendable area BA and the flat areas FA1 and FA2 in the cover window CW is clear, the boundary can be easily viewed if the slope change before and after the boundary becomes significant. However, in the embodiment, when the bendable area BA is modified and etched, the thickness of the cover window CW may change gradually around the boundary between the bendable area BA and the flat areas FA1 and FA2, and the boundary between the flat areas FA1 and FA2 and the bendable area BA may be prevented from being viewed (or at least the visibility of the boundary may be minimized). In addition, the depth modified in the bendable area BA can be adjusted, and the shape of the groove GV formed by etching can be adjusted by appropriately customizing the energy distribution of the line beam LB or the planar-shaped beam PB to further minimize the visibility of the boundary between the bendable area BA and the flat areas FA1 and FA1.

Figure 7:
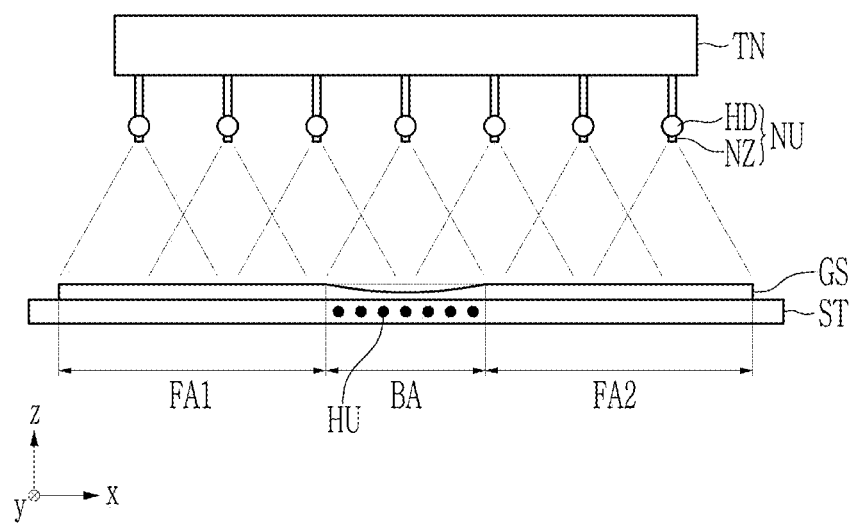
FIG. 7 is a schematic view of a task of etching in the manufacturing method of the cover window according to the embodiment.

FIG. 7 is a schematic view of the etching in the manufacturing method of the cover window according to the embodiment.

The glass substrate GS, of which the bendable area BA is modified by the pre-processing (S20) task, may be etched in the etching (S30) task in an etching device. The etching device may include a stage ST, a heating unit HU, a nozzle unit UN, a storage tank TN, and the like.

The stage ST may have a plate shape (i.e., the stage ST may be planar). The heating unit HU may be located at a center portion of the stage ST. The heating unit HU may include heating elements that are arranged and spaced apart from each other along the first direction (x-axis direction) and extending in the second direction (y-axis direction).

The nozzle unit NU may include nozzle heads HD that are arranged and spaced apart from each other along the first direction (x-axis direction) and extend in the second direction (y-axis direction). In each nozzle head HD, nozzles may be disposed at a predetermined distance from each other. The nozzles NZ may spray the etchant in a direction toward the stage ST (e.g., downward). The etchant may contain hydrofluoric acid (HF).

The storage tank TN may store the etchant. The storage tank TN may be connected to the nozzle unit NU to provide or supply the etchant to the nozzle unit NU.

The etching device may further include a cleaning unit for removing etchants and impurities remaining on the etched glass substrate GS, and a drying unit for drying the cleaned glass substrate GS.

During the etching (S30) task, the pre-processed glass substrate GS may be placed on the stage ST. In one or more embodiments, the bendable area BA of the glass substrate GS may be located to be overlapped with the heating unit HU. The center of the heating unit HU and the center of the bendable area BA may coincide in the first direction (x-axis direction) (i.e., the bendable area BA may be laterally centered relative to the heating unit HU).

When the stage ST is partially heated by driving the heating unit HU, the bendable area BA of the glass substrate GS, which overlaps the heating unit HU, may also be heated. Accordingly, the bendable area BA of the glass substrate GS may be heated to be a higher temperature than the flat areas FA1 and FA2. Once the bendable area BA has been heated by the heating unit HU, the glass substrate GS may be etched by spraying the etchant onto the glass substrate GS using the nozzle unit NU.

The heating unit HU may heat the bendable area BA so that the temperature decreases in a direction starting from the center of the bendable area BA and toward the boundary between the bendable area BA and the flat areas FA1 and FA2 (i.e., the temperature of the glass substrate GS may be a maximum in the center of the bendable area BA and the temperature may decrease in the +x-direction and the −x-direction toward the boundary between the bendable area BA and the flat areas FA1 and FA2). For example, the heat applied to the bendable area BA by the heating unit HU may have a Gaussian distribution or a Lorentz distribution with respect to the center line of the bendable area BA.

Since the temperature of the bendable area BA of the glass substrate GS is higher than that of the flat areas FA1 and FA2, the etching speed (in the etching (S30) task) of the bendable area BA may be faster than that of the flat areas FA1 and FA2. In addition, since the bendable area BA has been modified by the pre-processing (S20) task, the bendable area BA can be etched more rapidly than the flat areas FA1 and FA2. The etch selectivity of the bendable area BA relative to the flat areas FA1 and FA2 can be further increased by selective pre-processing and selective heating the bendable area BA. In one or more embodiments, with a single etching (S30) task, the thickness of the flat areas FA1 and FA2 can be reduced to the desired thickness, and the groove GV can be formed in the bendable area BA.

The etching process may be suitable for mass production, and may be a machining method with a low deviation in external dimensions for each product. Therefore, the cover window CW manufactured by the etching process can induce the formation of a uniform stress distribution when the display device is folded, the stress distribution can induce stress concentration in the same area in terms of the structure of the display device, and it can therefore improve the reliability against damage to the display device.

In the etching (S30) task, parameters of the etching process can be controlled by adjusting design parameters such as a pitch between nozzle heads HD, a pitch between nozzles NZ, a distance between a nozzle NZ and the glass substrate GS, and/or adjusting selectable variables such as the spray angle, time, concentration, flow rate, and temperature of the etchant.

Figure 8:
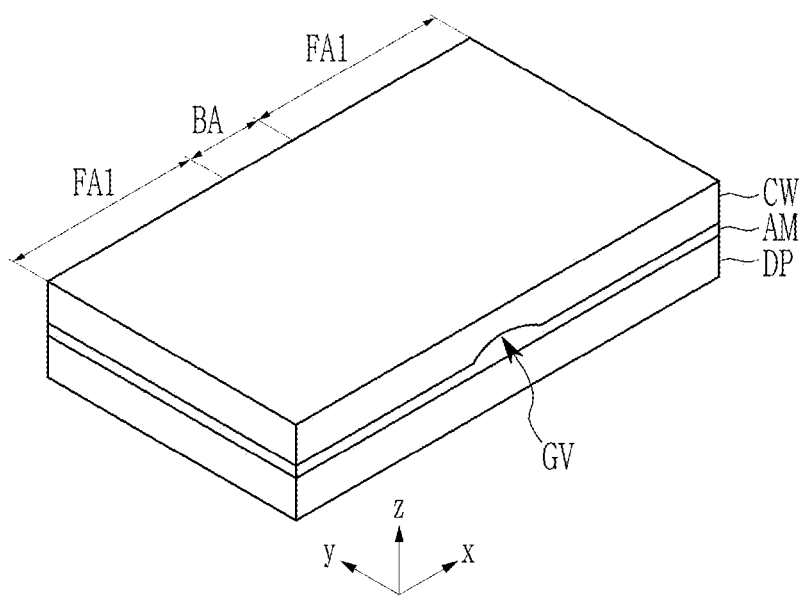
FIG. 8 is a perspective view of a task of attaching of the display panel in the manufacturing method of the display device according to the embodiment.

FIG. 8 is a perspective view of the task of attaching (S50) of the display panel in the method of manufacturing the display device according to the embodiment.

As described above, the glass substrate GS, of which the bendable area BA is made thinner by etching through the pre-processing (S20) and the etching (S30), can be provided as the cover window CW. The display panel DP, which may be a light emitting display panel, may be attached to the cover window CW. The cover window CW may be attached to the display panel DP so that the groove GV faces the display panel DP, as illustrated in FIG. 8. The cover window CW and the display panel DP may be bonded to each other by an adhesive member AM, and the groove GV may be filled with the adhesive member AM. The adhesive member AM may include an optically transparent adhesive (OCA), an optically transparent resin (OCR), a pressure sensitive adhesive (PSA), or the like.

The adhesive member AM may have the same or almost the same refractive index as the cover window CW. Accordingly, an image displayed by the display panel DP may not be distorted by the cover window CW and the adhesive member AM. That is, the groove GV is filled with the adhesive member AM, of which a refractive index is the same as or almost the same as that of the cover window CW, thereby preventing refraction of light, which might otherwise distort the image displayed by the display panel DP. In addition, the adhesive member AM may block or at least mitigate against moisture or other foreign matter from getting into the groove GV, which may prevent a crack in the groove GV from growing, and may increase resistance to damage due to long-term fatigue.

Figure 9:
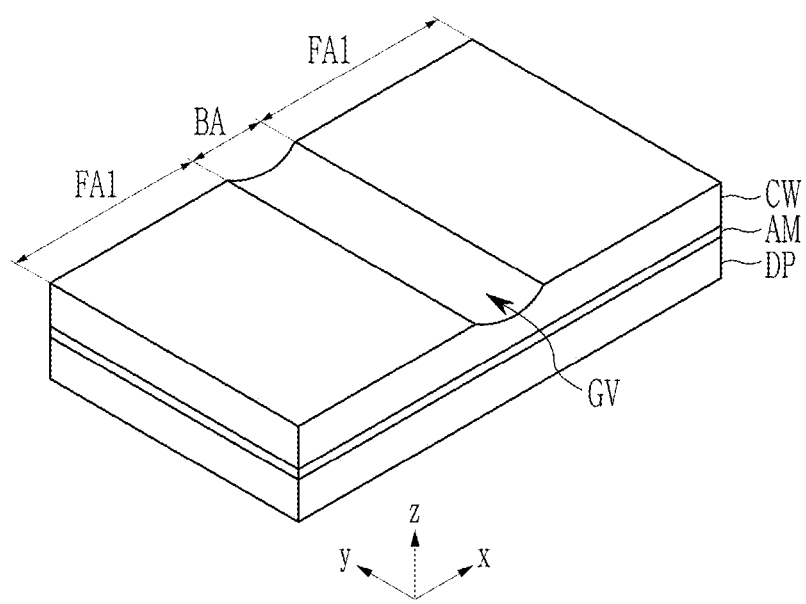
FIG. 9 is a perspective view of a task of attaching of the display panel in the manufacturing method of the display device according to the embodiment.
Figure 10:
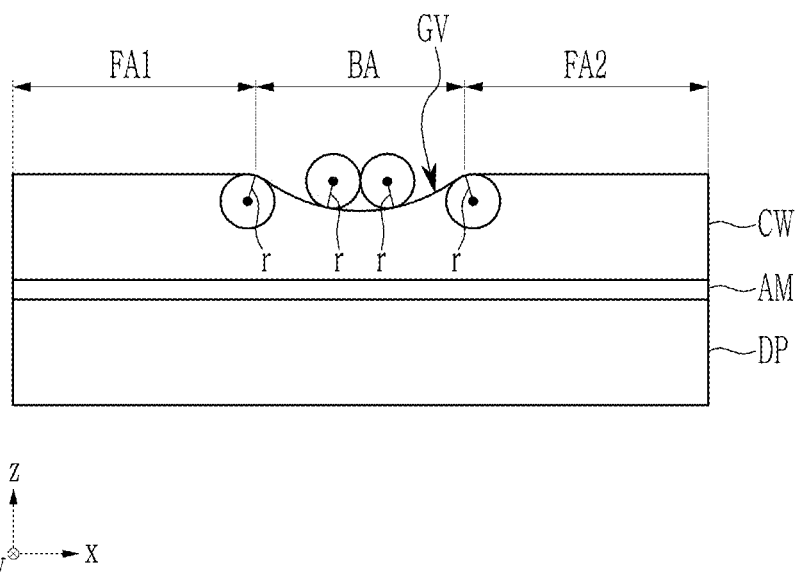
FIG. 10 is a cross-sectional view of the display device shown in FIG. 9, taken along the first direction.

FIG. 9 is a perspective view of the task of attaching (S50) of the display panel in the method of manufacturing the display device according to an embodiment, and FIG. 10 is a cross-sectional view of the display device shown in FIG. 9, taken along the first direction.

Referring to FIG. 9, the display panel DP may be attached so that the groove GV of the cover window CW does not face the display panel DP (i.e., the groove GV of the cover window CW faces away from the display panel DP). That is, the cover window CW and the display panel DP may be attached so that the groove GV is exposed to the outside of the display device. The adhesive member AM, which may include the OCA, the OCR, the PSA, or the like, may be disposed between the cover window CW and the display panel DP. Since the groove GV is disposed outside the display device, the image displayed by the display panel DP may be refracted by the groove GV.

Referring to FIG. 10, in the display device, the groove GV is formed on the upper surface of the cover window CW. The groove surface forming the groove GV may have curvature radii defined in a plane perpendicular to the second direction (the y-axis direction) (i.e., the groove GV may have a series of curvature radii in the z-x plane). One end and the other end of the groove surface forming the groove GV may correspond to the boundary between the bendable area BA and the first flat area FA1 and the boundary between the bendable area BA and the second flat area FA2, respectively. One end and the other end of the groove surface forming the groove GV may be formed to have a minimum curvature radius r among the curvature radii of the groove surface. At least one internal point between one end and the other end of the groove face may be formed to have the minimum curvature radius r among the curvature radii of the groove surface. Since the groove surface has a minimum curvature radius r at one end and the other end, the groove surface forms a groove GV with a gentle slope (i.e., the groove surface is formed such that there are gentle transitions between the groove GV and the first and second flat areas FA1 and FA1). As the slope of the groove surface of the groove GV is gentle, the angle between the incident light and the groove surface is closer to 90 degrees. Thus, the refraction of light is minimized or at least reduced such that image distortion of the image displayed by the display panel DP is not visually recognized or perceptible. The minimum curvature radius r of one end and the other end of the groove surface may be more than a predetermined value (e.g., about 1 m or more) and thus one end and the other end of the groove surface are not visually recognized or perceptible.

In order to form one end and the other end of the groove to have a predetermined curvature radius r, machining such as polishing or sandblasting, and/or thermal processing such as thermal compression may be performed in conventional methods. However, in the case of mechanical processing or thermal processing, precise dimensional control may be difficult, and fine cracks may increase and deteriorate strength and optical characteristics (e.g., resulting in haze). In addition, processing dimension errors for each product may occur, and thus the stress distribution for each product is not uniform and the stress distribution may increase.

According to one or more embodiments, the bendable area BA of the glass substrate GS is modified by performing pre-processing (S20) using the line beam or the planar-shaped beam without performing the above-stated mechanical processing or thermal processing, and then etched (S30) such that one side and the other side of the groove surface may form the groove GV having the predetermined curvature radius r. Accordingly, problems that may occur during the machining or thermal processing can be prevented or solved, and the processing time can be shortened because the conventional machining or thermal processing are not performed. In addition, since the deviation of the external dimensions of each product is low, it is possible to induce a uniform or substantially uniform stress distribution when folding the display device. The uniform or substantially uniform stress distribution can induce stress concentration in the same area in terms of the structure of the display device, which can improve the reliability of the display device against damage or failure.

The configuration of the display panel DP that can be included in the display device according to one embodiment will now be described focusing on the display area DA.

Figure 11:
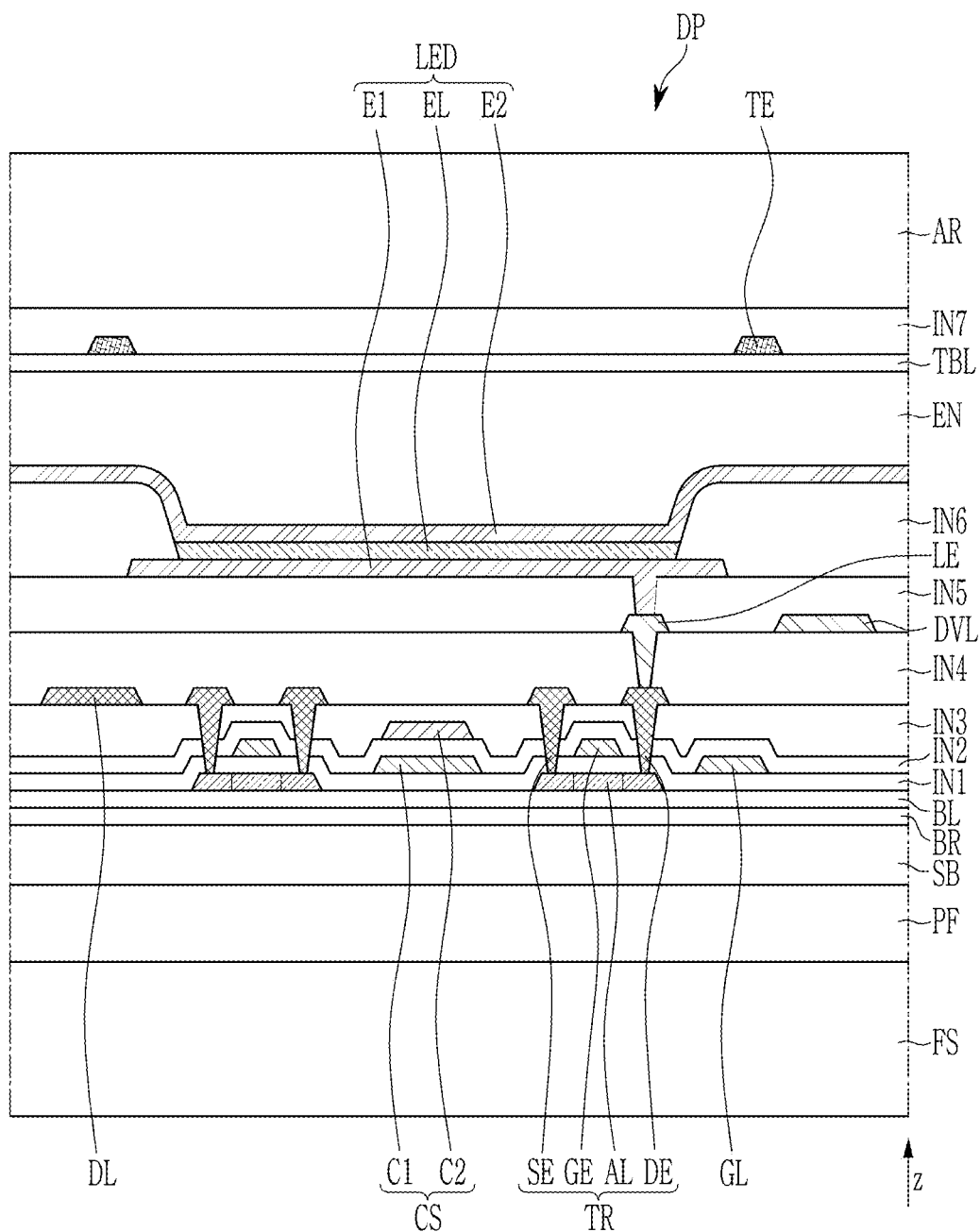
FIG. 11 is a schematic cross-sectional view of a layered structure of the display panel according to the embodiment.

FIG. 11 is a schematic cross-sectional view of a layered structure of the display panel according to one embodiment. The cross-section shown in FIG. 11 may correspond to approximately one pixel area.

The display panel DP includes, among other things, a substrate SB, a transistor TR formed on the substrate SB, and a light emitting diode LED connected to the transistor TR. The light emitting diode LED may correspond to a pixel.

The substrate SB may be a flexible substrate that is made of a polymer such as a polyimide, a polyamide, and/or a polyethylene terephthalate.

A barrier layer BR that prevents moisture, oxygen, and the like from penetrating the substrate SB may be provided on the substrate SB. The barrier layer BR may include an inorganic insulating material such as a silicon nitride (SiNx), a silicon oxide (SiOx), and/or a silicon oxynitride (SiOxNy), and may be formed of a single layer or multiple layers.

A buffer layer BL may be provided on the barrier layer BR. The buffer layer BL may include an inorganic insulating material such as a silicon nitride (SiNx), a silicon oxide (SiOx), and a silicon oxynitride (SiOxNy), and may be formed of a single layer or multiple layers.

A semiconductor layer AL of the transistor TR may be provided on the buffer layer BL. The semiconductor layer AL may include a source region, a drain region, and a channel region between the source region and the drain region. The semiconductor layer AL may include any one of amorphous silicon, a polysilicon, and an oxide semiconductor. For example, the semiconductor layer AL may include a low temperature polysilicon (LTPS), or an oxide semiconductor material including at least one of zinc (Zn), indium (In), gallium (Ga), and tin (Sn). For example, the semiconductor layer may include indium-gallium-zinc oxide (IGZO).

A first insulation layer IN1 may be provided on the semiconductor layer AL. The first insulation layer IN1 may include inorganic insulating materials such as a silicon nitride (SiNx), a silicon oxide (SiOx), and/or silicon oxynitride (SiOxNy), and may be formed of a single layer or multiple layers.

A first gate conductive layer, which may include a gate electrode GE of the transistor TR, a gate line GL, and a first electrode C1 of a capacitor CS, may be provided on the first insulation layer IN1. The first gate conductive layer may include molybdenum (Mo), aluminum (Al), copper (Cu), titanium (Ti), or the like, and may be formed of a single layer or multiple layers.

A second insulation layer IN2 may be provided on the first gate conductive layer. The second insulation layer IN2 may include an inorganic insulating material such as a silicon nitride (SiNx), a silicon oxide (SiOx), or a silicon oxynitride (SiOxNy), and may be a single layer or multiple layers.

A second gate conductive layer, which may include a second electrode C2 of the capacitor CS, may be provided on the second insulation layer IN2. The second gate conductive layer may include molybdenum (Mo), aluminum (Al), copper (Cu), titanium (Ti), or the like, and may be formed of a single layer or multiple layers.

A third insulation layer IN3 may be provided on the second insulation layer IN2 and the second gate conductive layer. The third insulation layer IN3 may include an inorganic insulating material such as a silicon nitride (SiNx), a silicon oxide (SiOx), or a silicon oxynitride (SiOxNy), and may be formed of a single layer or multiple layers.

A first data conductive layer, which may include a source electrode SE, a drain electrode DE, and a data line DL of the transistor TR, may be provided on the third insulation layer IN3. The source electrode SE and the drain electrode DE may be connected to a source region and a drain region, respectively, of the semiconductor layer AL through contact holes in the insulation layers IN1, IN2, and IN3. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), copper (Cu), or the like, and may be formed of a single layer or multiple layers.

A fourth insulation layer IN4 may be provided on the first data conductive layer. The fourth insulation layer IN4 may be an organic layer. For example, the fourth insulation layer IN4 may include an organic insulating material such as a general purpose polymer such as a poly(methylmethacrylate) or a polystyrene, a polymer derivative having a phenolic group, an acryl-based polymer, an imide polymer, a polyimide, an acryl-based polymer, a siloxane-based polymer, or the like.

A second data conductive layer, which may include a driving voltage line DVL, a link electrode LE, and the like, may be provided on the fourth insulation layer IN4. The link electrode LE may be connected to the drain electrode DE through a contact hole of the fourth insulation layer IN4. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), copper (Cu), or the like, and may be formed of a single layer or multiple layers.

A fifth insulation layer IN5 may be provided on the second data conductive layer. The fifth insulation layer IN5 may be an organic layer. For example, the fifth insulation layer IN5 may include an organic insulating material such as a general purpose polymer such as a poly(methylmethacrylate) or a polystyrene, a polymer derivative having a phenolic group, an acryl-based polymer, an imide polymer, a polyimide, an acryl-based polymer, a siloxane-based polymer, or the like.

A first electrode E1 of the light emitting diode LED may be provided on the fifth insulation layer IN5. The first electrode E1 may be called a pixel electrode. The first electrode E1 may be connected to the link electrode LE through a contact hole in the fifth insulation layer IN5. Thus, the first electrode E1 is electrically connected with the drain electrode DE and thus may receive a data signal that controls luminance of the light emitting diode LED. The transistor TR to which the first electrode E1 is connected may be a driving transistor or a transistor that is electrically connected with the driving transistor. The first electrode E1 may be formed of a reflective conducting material or a transflective conducting material, or it may be formed of a transparent conductive material. The first electrode E1 may include a transparent conductive material such as an indium tin oxide (ITO) or an indium zinc oxide (IZO). The first electrode E1 may include a metal or metal alloy such as one including lithium (Li), calcium (Ca), aluminum (Al), silver (Ag), magnesium (Mg), and/or gold (Au).

A sixth insulation layer IN6 may be provided on the fifth insulation layer IN5. The sixth insulation layer IN6 may be called a pixel defining layer or a partitioning wall, and may have an opening that overlaps the first electrode E1. The fifth insulation layer IN5 may include an organic insulating material such as an acryl-based polymer or an imide-based polymer.

An emission layer EL may be provided on the first electrode E1. In addition to the emission layer EL, at least one of a hole injection layer (HIL), a hole transport layer (HTL), an electron transport layer (ETL), and an electron injection layer (EIL) may be provided on the first electrode E1.

A second electrode E2 may be provided on the emission layer EL. The second electrode E2 may be called a common electrode. The second electrode E2 is made of a metal or metal alloy with a low work function, such as one including calcium (Ca), barium (Ba), magnesium (Mg), aluminum (Al), and/or silver (Ag), and thus it has light transmittance. The second electrode E2 may include a transparent conductive oxide such as an indium tin oxide (ITO) or an indium zinc oxide (IZO).

The first electrode E1, the emission layer EL, and the second electrode E2 of each pixel PX form a light emitting diode LED such as an organic light emitting diode (OLED). The first electrode E1 may be an anode of the light emitting diode, and the second electrode E2 may be a cathode of the light emitting diode.

An encapsulation layer EN may be provided on the second electrode E2. The encapsulation layer EM can prevent or at least mitigate against the penetration of moisture or oxygen from the outside by encapsulating the light emitting diode LED. The encapsulation layer EN may be a thin film encapsulation layer including at least one inorganic layer and at least one organic layer.

A buffer layer TBL may be disposed on the encapsulation layer EN. The buffer layer TBL may include an inorganic insulating material such as a silicon nitride (SiNx), a silicon oxide (SiOx), and/or a silicon oxynitride (SiOxNy), and may be formed of a single layer or multiple layers.

A touch sensor layer including a touch electrode TE may be provided on the buffer layer TBL. The touch electrode TE may have a mesh shape having an opening overlapping the light emitting diode LED.

A seventh insulation layer IN7 that covers the touch electrode TE may be provided on the touch sensor layer. The seventh insulation layer IN7 may include inorganic insulating materials such as a silicon nitride (SiNx), a silicon oxide (SiOx), and/or a silicon oxynitride (SiOxNy), and may be formed of a single layer or multiple layers.

An anti-reflection layer AR may be provided on the seventh insulation layer IN7 to reduce reflection of external light. The anti-reflection layer AR may include a polarization layer. The antireflection layer AR may be attached by an adhesive or formed on the seventh insulation layer IN7. Instead of the anti-reflection layer AR, the encapsulation layer EN, the touch sensor layer, and/or the seventh insulation layer IN7 may be formed in a refractive index matching structure to achieve an anti-reflection effect.

A protective film PF for protecting the display panel DP may be provided under the substrate SB. The protective film PF may be made of a polymer such as a polyethylene terephthalate, a polyethylene naphthalate, or a polyimide.

Under the protective film PF, a functional sheet FS including at least one of a cushion layer, a heat dissipation sheet, a light shielding sheet, a waterproof tape, and an electron blocking film may be provided.

While inventive concept has been described in connection with what is presently considered to be practical embodiments, it is to be understood that the inventive concept is not limited to the disclosed embodiments. On the contrary, it is intended to cover various modifications and equivalent arrangements included within the spirit and scope of the appended claims.

What is claimed is:

1. A method of manufacturing a cover window for a display device, the method comprising:
   providing a glass substrate comprising a bendable area and a flat area;
   modifying the bendable area by irradiating the glass substrate with a beam; and
   etching the bendable area to have a thinner thickness than the flat area,
   wherein the beam is a line beam having an intensity that decreases continuously in a Gaussian distribution from a center of the bendable area toward a boundary between the bendable area and the flat area, the line beam has a width set to correspond to a width of the bendable area,
   wherein the etching forms a groove in the bendable area and a gradual transition between the groove and the flat area, and
   wherein the irradiating the glass substrate with the beam comprises directing the beam through a plurality of mirrors and a plurality of lenses between two adjacent mirrors of the plurality of mirrors.

2. The method of manufacturing the cover window for the display device of claim 1, wherein the beam is a laser beam.

3. The method of manufacturing the cover window for the display device of claim 1, wherein, in the modifying of the bendable area, a modified depth of the glass substrate decreases from a center of the bendable area toward a boundary between the bendable area and the flat area.

4. The method of manufacturing the cover window for the display device of claim 1, wherein, in the etching of the bendable area, the bendable area is etched faster than the flat area due to the modifying of the bendable area.

5. The method of manufacturing the cover window for the display device of claim 1, wherein the etching of the bendable area further comprises heating the bendable area to a higher temperature than the flat area.

6. The method of manufacturing the cover window for the display device of claim 5, wherein, in the heating, a temperature applied to the bendable area has a Gaussian distribution with respect to a center line of the bendable area.

7. The method of manufacturing the cover window for the display device of claim 1, wherein the groove has a depth that decreases from a center of the bendable area toward a boundary between the bendable area and the flat area.

8. A method of manufacturing a flexible display device, the method comprising:
- providing a glass substrate comprising a bendable area and a flat area;
- irradiating at least the bendable area of the glass substrate with a beam;
- etching the glass substrate, wherein the bendable area is etched faster than the flat area; and
- attaching a display panel to the glass substrate to form the flexible display device,
- wherein the beam is a line beam having an intensity that decreases continuously in a Gaussian distribution from a center of the bendable area toward a boundary between the bendable area and the flat area, the line beam has a width set to correspond to a width of the bendable area,
- wherein the etching forms a groove in the bendable area and a gradual transition between the groove and the flat area, and
- wherein the irradiating the glass substrate with the beam comprises directing the beam through a plurality of mirrors and a plurality of lenses between two adjacent mirrors of the plurality of mirrors.

9. The method of manufacturing the flexible display device of claim 8, wherein the beam is a laser beam.

10. The method of manufacturing the flexible display device of claim 8, wherein, in the irradiating of the beam, the glass substrate is modified to have a modified depth that decreases from a center of the bendable area toward a boundary between the bendable area and the flat area.

11. The method of manufacturing the flexible display device of claim 8, wherein, in the etching of the glass substrate, the bendable area is etched faster than the flat area due to the irradiating of the bendable area with the beam.

12. The method of manufacturing the flexible display device of claim 8, wherein the etching of the glass substrate further comprises heating the bendable area to a higher temperature than the flat area.

13. The method of manufacturing the flexible display device of claim 12, wherein, in the heating, a temperature applied to the bendable area has a Gaussian distribution with respect to a center line of the bendable area.

14. The method of manufacturing the flexible display device of claim 8, wherein the bendable area has a groove surface that forms the groove, the groove surface has a plurality of curvature radii, and one end and another end of the groove surface each has a minimum curvature radius among the plurality of curvature radii.

* * * * *